(12) United States Patent
Kamigaichi

(10) Patent No.: US 12,356,623 B2
(45) Date of Patent: Jul. 8, 2025

(54) SEMICONDUCTOR DEVICE

(71) Applicant: KIOXIA CORPORATION, Tokyo (JP)

(72) Inventor: Takeshi Kamigaichi, Yokkaichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/648,933

(22) Filed: Apr. 29, 2024

(65) Prior Publication Data

US 2024/0292624 A1 Aug. 29, 2024

Related U.S. Application Data

(63) Continuation of application No. 18/334,693, filed on Jun. 14, 2023, now Pat. No. 12,004,352, which is a continuation of application No. 17/817,478, filed on Aug. 4, 2022, now Pat. No. 11,716,852, which is a continuation of application No. 17/185,179, filed on Feb. 25, 2021, now Pat. No. 11,444,102, which is a continuation of application No. 16/551,960, filed on Aug. 27, 2019, now Pat. No. 10,964,719, which is a continuation of application No. 16/021,500, filed on Jun. 28, 2018, now Pat. No. 10,446,576, which is a
(Continued)

(51) Int. Cl.
| | |
|---|---|
| *H10B 43/27* | (2023.01) |
| *H10B 41/27* | (2023.01) |
| *H10B 43/10* | (2023.01) |
| *H10B 43/30* | (2023.01) |
| *H10B 43/35* | (2023.01) |
| *H10D 30/69* | (2025.01) |
| *H10D 64/23* | (2025.01) |

(52) U.S. Cl.
CPC ........... *H10B 43/27* (2023.02); *H10B 43/10* (2023.02); *H10B 43/30* (2023.02); *H10B 43/35* (2023.02); *H10D 30/694* (2025.01); *H10D 64/252* (2025.01); *H10B 41/27* (2023.02)

(58) Field of Classification Search
CPC ...................................................... H01B 43/27
See application file for complete search history.

(56) References Cited

U.S. PATENT DOCUMENTS

| | | |
|---|---|---|
| 5,106,775 A | 4/1992 | Kaga |
| 5,374,576 A | 12/1994 | Kimura |
| (Continued) | | |

FOREIGN PATENT DOCUMENTS

| | | | |
|---|---|---|---|
| JP | 2011-23586 | | 2/2011 |
| TW | 384543 B | * | 3/2000 |

OTHER PUBLICATIONS

TW_384543 (Year: 2000).*

*Primary Examiner* — William A Harriston
(74) *Attorney, Agent, or Firm* — Oblon, McClelland, Maier & Neustadt, L.L.P.

(57) ABSTRACT

A semiconductor body device includes a stacked body including a plurality of electrode layers stacked with an insulator interposed, a semiconductor body extending in a stacking direction of the stacked body through the electrode layers and having a pipe shape, a plurality of memory cells being provided at intersecting portions of the semiconductor body with the electrode layers, and a columnar insulating member extending in the stacking direction inside the semiconductor body having the pipe shape.

20 Claims, 11 Drawing Sheets

Related U.S. Application Data continuation of application No. 15/787,848, filed on Oct. 19, 2017, now Pat. No. 10,043,823, which is a continuation of application No. 15/344,876, filed on Nov. 7, 2016, now Pat. No. 9,831,269, which is a continuation of application No. 14/827,495, filed on Aug. 17, 2015, now Pat. No. 9,524,982.

(60) Provisional application No. 62/130,159, filed on Mar. 9, 2015.

(56) References Cited

U.S. PATENT DOCUMENTS

| | | | |
|---|---|---|---|
| 5,459,094 | A | 10/1995 | Jun |
| 5,877,053 | A | 3/1999 | Wu |
| 7,439,134 | B1 | 10/2008 | Prinz |
| 7,732,891 | B2 * | 6/2010 | Tanaka ............... H10D 62/115 438/411 |
| 7,985,687 | B1 | 7/2011 | Hui |
| 8,026,546 | B2 | 9/2011 | Murata |
| 8,187,938 | B2 * | 5/2012 | Lim ..................... H10B 41/27 438/269 |
| 8,258,038 | B2 | 9/2012 | Nozawa |
| 8,349,681 | B2 | 1/2013 | Alsmeier |
| 8,461,566 | B2 | 6/2013 | Tang |
| 8,673,721 | B2 | 3/2014 | Toshiro et al. |
| 8,710,484 | B2 | 4/2014 | Wei |
| 8,822,971 | B2 | 9/2014 | Park |
| 8,872,256 | B2 | 10/2014 | Lee et al. |
| 8,891,277 | B2 | 11/2014 | Murooka |
| 9,076,820 | B2 | 7/2015 | Kitazaki et al. |
| 9,209,291 | B2 | 12/2015 | Bin |
| 9,263,459 | B1 | 2/2016 | Li |
| 9,818,758 | B2 | 11/2017 | Lee |
| 10,043,823 | B2 | 8/2018 | Kamigaichi |
| 10,411,028 | B2 | 9/2019 | Arisumi |
| 2004/0212019 | A1 | 10/2004 | Shinohara |
| 2008/0067554 | A1 * | 3/2008 | Jeong .................... H10B 69/00 257/E27.103 |
| 2008/0265235 | A1 * | 10/2008 | Kamigaichi ........... H10B 63/30 257/E47.001 |
| 2009/0014774 | A1 | 1/2009 | Ono |
| 2009/0085153 | A1 * | 4/2009 | Maxwell ............ G11C 13/0069 257/E21.613 |
| 2009/0230458 | A1 | 9/2009 | Ishiduki |
| 2009/0278193 | A1 | 11/2009 | Murata |
| 2010/0117047 | A1 * | 5/2010 | Tanaka ................. H10B 63/20 257/E21.085 |
| 2010/0237402 | A1 | 9/2010 | Sekine et al. |
| 2010/0258852 | A1 | 10/2010 | Lim et al. |
| 2011/0018052 | A1 | 1/2011 | Fujiwara et al. |
| 2011/0147823 | A1 | 6/2011 | Kuk et al. |
| 2012/0070944 | A1 | 3/2012 | Kim |
| 2012/0241844 | A1 | 9/2012 | Iguchi |
| 2012/0256247 | A1 | 10/2012 | Alsmeier |
| 2013/0009235 | A1 | 1/2013 | Yoo |
| 2013/0264628 | A1 | 10/2013 | Koval |
| 2014/0063936 | A1 | 3/2014 | Shim |
| 2014/0322874 | A1 | 10/2014 | Akita |
| 2015/0261182 | A1 | 9/2015 | Katsumata |
| 2015/0348799 | A1 | 12/2015 | Hong |
| 2016/0043093 | A1 | 2/2016 | Lee |
| 2016/0086970 | A1 | 3/2016 | Peng |
| 2017/0243881 | A1 | 8/2017 | Shin |
| 2017/0271358 | A1 | 9/2017 | Mori |
| 2018/0040630 | A1 | 2/2018 | Kamigaichi |
| 2018/0108670 | A1 | 4/2018 | Pavlopoulos |
| 2019/0103411 | A1 | 4/2019 | Liu |

* cited by examiner

SEMICONDUCTOR DEVICE

CROSS-REFERENCE TO RELATED APPLICATION

This application is a continuation of and claims benefit under 35 U.S.C. § 120 to U.S. application Ser. No. 18/334,693, filed Jun. 14, 2023, which is a continuation of and claims benefit under 35 U.S.C. § 120 to U.S. application Ser. No. 17/817,478, (now U.S. Pat. No. 11,716,852) filed Aug. 4, 2022, which is a continuation of and claims benefit under 35 U.S.C. § 120 to U.S. application Ser. No. 17/185,179, (now U.S. Pat. No. 11,444,102) filed Feb. 25, 2021, which is a continuation of and claims benefit under 35 U.S.C. § 120 to U.S. application Ser. No. 16/551,960, (now U.S. Pat. No. 10,964,719) filed Aug. 27, 2019, which is a continuation of and claims benefit under 35 U.S.C. § 120 to U.S. application Ser. No. 16/021,500, (now U.S. Pat. No. 10,446,576) filed Jun. 28, 2018, which is a continuation of and claims benefit under 35 U.S.C. § 120 to U.S. application Ser. No. 15/787,848, (now U.S. Pat. No. 10,043,823) filed Oct. 19, 2017, which is a continuation of and claims benefit under 35 U.S.C. § 120 to U.S. application Ser. No. 15/344,876, (now U.S. Pat. No. 9,831,269) filed Nov. 7, 2016, which is a continuation of and claims benefit under 35 U.S.C. § 120 to U.S. application Ser. No. 14/827,495, (now U.S. Pat. No. 9,524,982) filed Aug. 17, 2015, which is based upon and claims benefit under 35 U.S.C. § 119 (e) to U.S. Provisional Patent Application No. 62/130,159, filed on Mar. 9, 2015; the entire contents of each of which are incorporated herein by reference.

FIELD

Embodiments described herein relate generally to a semiconductor device.

BACKGROUND

A memory device having three-dimensional structure is proposed. In the memory device, memory holes are formed in a stacked body including a plurality of electrode layers. A charge storage film and a semiconductor film extending in a staking direction of the stacked body are provided in the memory holes.

The memory holes are formed by e.g. anisotropic dry etching. When the aspect ratios of the memory holes are higher, it becomes difficult to control the diameters of the memory holes to be uniform in the depth direction. The differences in diameter of the memory holes lead to variations in memory cell characteristics.

DETAILED DESCRIPTION

Figure 1:
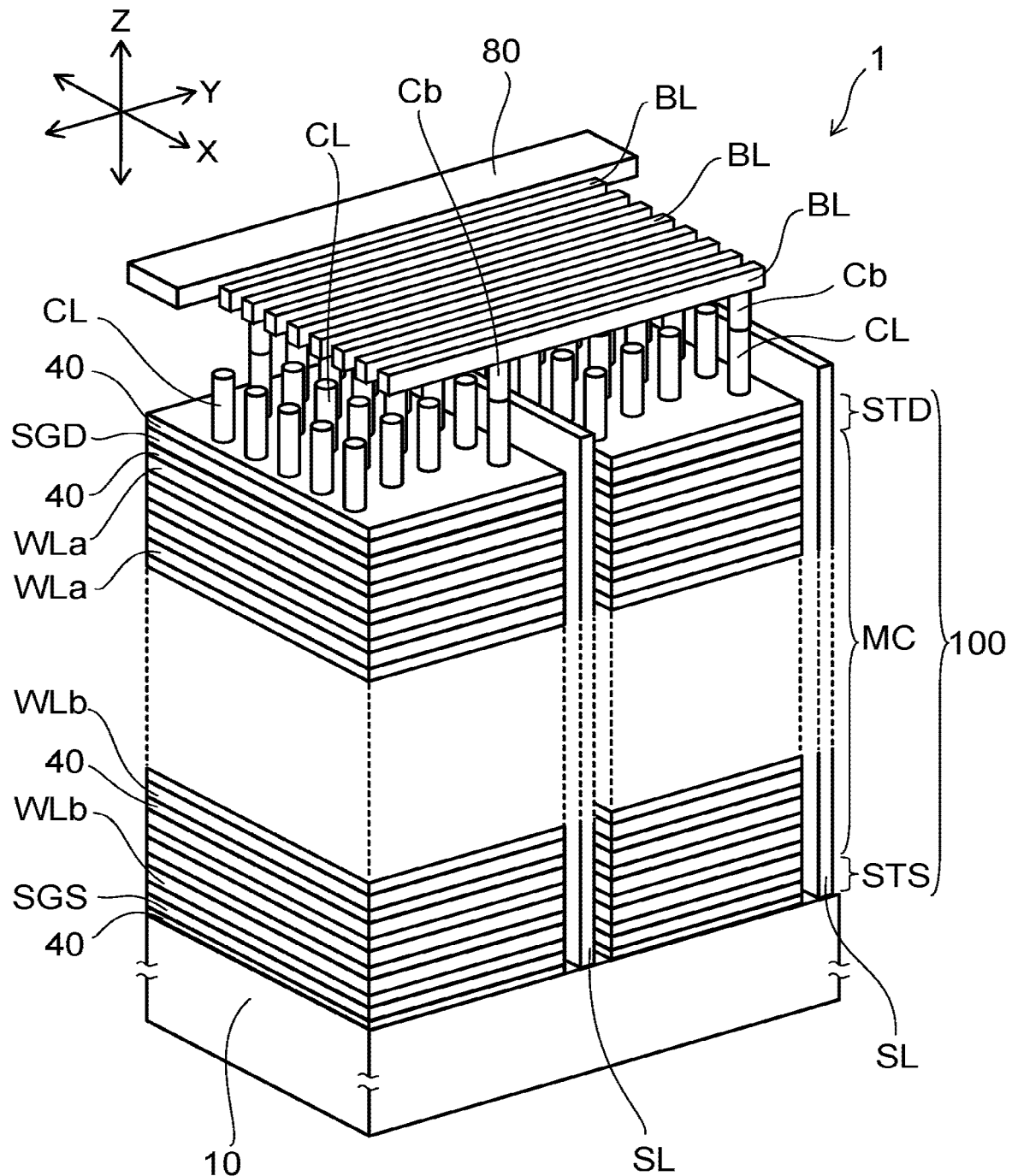
FIG. 1 is a schematic perspective view of a memory cell array of a semiconductor device of an embodiment.

According to one embodiment, a semiconductor device includes a stacked body and a columnar part. The stacked body includes a plurality of electrode layers stacked with an insulator between the electrode layers. The columnar part includes a semiconductor body, a charge storage film, a first insulating film, and a second insulating film. The semiconductor body extends in the stacked body in a stacking direction of the stacked body. The charge storage film is provided between the semiconductor body and the electrode layers. The first insulating film is provided between the semiconductor body and the charge storage film. The second insulating film is provided between the charge storage film and the electrode layers. The columnar part includes a first portion having a first diameter, and a second portion having a second diameter smaller than the first diameter. The electrode layers include a first electrode layer contiguous to the first portion, and a second electrode layer contiguous to the second portion and thinner than the first electrode layer. The semiconductor body of the first portion includes a first semiconductor part and a second semiconductor part. The first semiconductor part extends in the stacking direction. The second semiconductor part is provided between the first semiconductor part and the first electrode layer. The second semiconductor part has an end located closer to the first electrode layer side than the first semiconductor part. The first insulating film of the second portion includes a first insulating part and a second insulating part. The first insulating part extends in the stacking direction. The second insulating part is provided between the first insulating part and the second electrode layer. The second insulating part has an end located closer to the second electrode layer side than the first insulating part.

Embodiments will now be described with reference to the drawings. In the respective drawings, like members are labeled with like reference numerals.

Semiconductor devices of the embodiments are semiconductor memory devices having memory cell arrays.

FIG. 1 is a schematic perspective view of a memory cell array 1 of the embodiment.

In FIG. 1, two directions in parallel to a major surface of a substrate 10 and orthogonal to each other are an X-direction (first direction) and a Y-direction (second direction), and a direction orthogonal to both the X-direction and the Y-direction is a Z-direction (third direction, stacking direction).

The memory cell array 1 has a stacked body 100 including a plurality of electrode layers WLa, WLb, a drain-side select gate SGD, a source-side select gate SGS, a plurality of columnar parts CL, and a plurality of separation parts ST.

The columnar parts CL are formed in circular cylinder shapes or elliptic cylinder shapes extending in the stacking direction (Z-direction) in the stacked body 100. The separation parts ST extend in the stacking direction (Z-direction) and the X-direction in the stacked body 100 and separate the stacked body 100 in the Y-direction.

The source-side select gate (lower gate layer) SGS is provided on the substrate 10. A stacked body including the plurality of electrode layers WL is provided on the source-side select gate SGS. The drain-side select gate (upper gate layer) SGD is provided on the stacked body.

Figure 2:
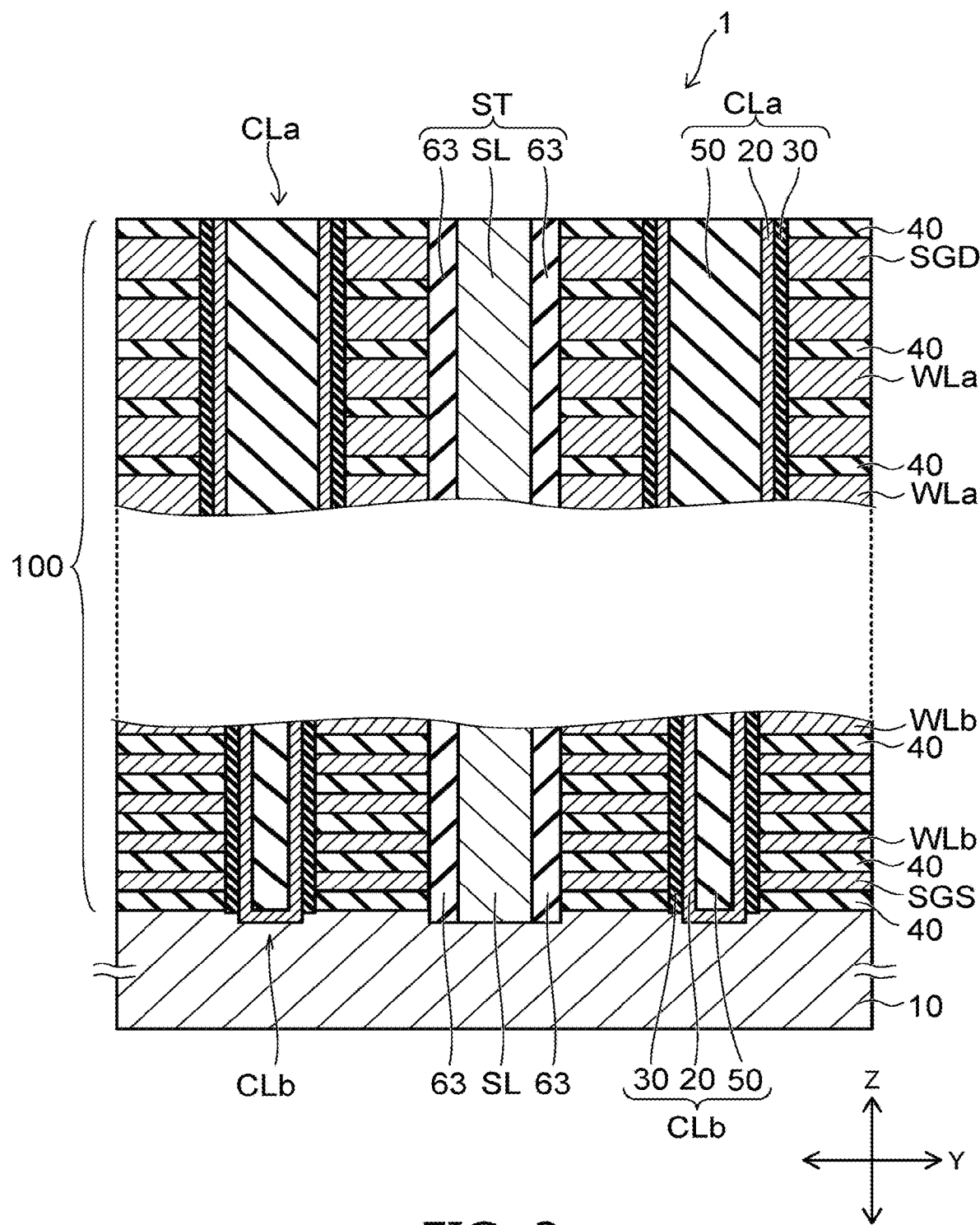
FIG. 2 is a schematic cross-sectional view of the memory cell array of the semiconductor device of the embodiment.

FIG. 2 is a schematic sectional view of the memory cell array 1. FIG. 2 corresponds to a section in parallel to the Y-Z plane in FIG. 1. FIG. 2 extracts and shows the part of the upper layer side of the memory cell array 1 and the part of the lower layer side (substrate 10 side).

The columnar part CL has a first portion CLa having a first diameter and a second portion CLb having a second diameter. The first portion CLa and the second portion CLb are continuous in the stacking direction (Z-direction) of the stacked body 100.

The first portion CLa is provided on the upper side of the center part in the stacking direction (Z-direction) of the stacked body 100. The second portion CLb is provided on the lower side (substrate 10 side) of the center part in the stacking direction of the stacked body 100.

The diameter of the second portion CLb is smaller than the diameter of the first portion CLa. That is, the diameter of the columnar part CL at the bottom side is smaller than that at the top side.

In the embodiment, the cylindrical columnar part CL is assumed, however, actually, a memory hole MH (shown in FIG. 5) in which the columnar part CL is formed has, not a perfect circle shape, but often a shape deformed from a perfect circle (oval or the like). In this case, the diameter of the columnar part CL may be defined as an effective diameter obtained from a section area by cutting of the columnar part CL along a plane orthogonal to its extension direction (Z-direction) (a plane in parallel to the X-Y plane).

That is, supposing that the section area is S and the effective diameter of the columnar part CL is R, the effective diameter R of the columnar part CL appropriate for the section area S may be obtained from a relational expression $S=\pi(R/2)^2$.

The plurality of electrode layers have the plurality of first electrode layers WLa and the plurality of second electrode layers WLb. The first electrode layers WLa are contiguous to the first portion CLa of the columnar part CL and surround the first portion CLa. The second electrode layers WLb are contiguous to the second portion CLb of the columnar part CL and surround the second portion CLb.

The thickness of the first electrode layer WLa is thicker than the thickness of the second electrode layer WLb. Of the plurality of electrode layers, the thicknesses of e.g. the several first electrode layers WLa at the upper layer side are thicker than the thicknesses of e.g. the several second electrode layers WLb at the lower layer side.

An electrode layer having the same thickness as the first electrode layer WLa or the second electrode layer WLb is stacked between the first portion CLa and the second portion CLb of the columnar part CL. Or, an electrode layer having an intermediate thickness between the thickness of the first electrode layer WLa and the thickness of the second electrode layer WLb is stacked between the first portion CLa and the second portion CLb of the columnar part CL.

The source-side select gate SGS, the drain-side select gate SGD, and the electrode layers including the first electrode layers WLa and the second electrode layers WLb are metal layers. For instance, the source-side select gate SGS, the drain-side select gate SGD, and the electrode layers contain tungsten or molybdenum as a major component. Or, the source-side select gate SGS, the drain-side select gate SGD, and the electrode layers are silicon layers containing silicon as a major component and e.g. boron is doped in the silicon layers as an impurity for providing conductivity. The silicon layers may contain metal silicide.

The source-side select gate SGS, the drain-side select gate SGD, and the electrode layers are stacked on the substrate 10 via an insulator. The insulator is e.g. an insulating layer 40, or may be an air gap. The insulating layer 40 is provided between the substrate 10 and the source-side select gate SGS. The insulating layer 40 is provided between the source-side select gate SGS and the second electrode layer WLb. The insulating layer 40 is provided between the second electrode layers WLb. The insulating layer 40 is provided between the first electrode layers WLa. The insulating layer 40 is provided between the first electrode layer WLa and the drain-side select gate SGD.

The insulating layer 40 is e.g. a silicon oxide film. Or, the insulating layer 40 may include an air gap inside.

In the example shown in FIG. 1, the plurality of columnar parts CL are provided in a hound's-tooth check pattern. Or, the plurality of columnar parts CL may be provided in a square-lattice arrangement along the X-direction and the Y-direction.

A plurality of bit lines (e.g. metal films) BL are provided on the stacked body 100. The plurality of bit lines BL are separated from each other in the X-direction and the respective bit lines BL extend in the Y-direction.

The upper ends of the columnar parts CL are connected to the bit lines BL via contact parts Cb. The plurality of columnar parts CL, each of which is selected from each of areas (blocks) separated in the Y-direction by the separating parts ST, are connected to one common bit line BL.

Figure 3:
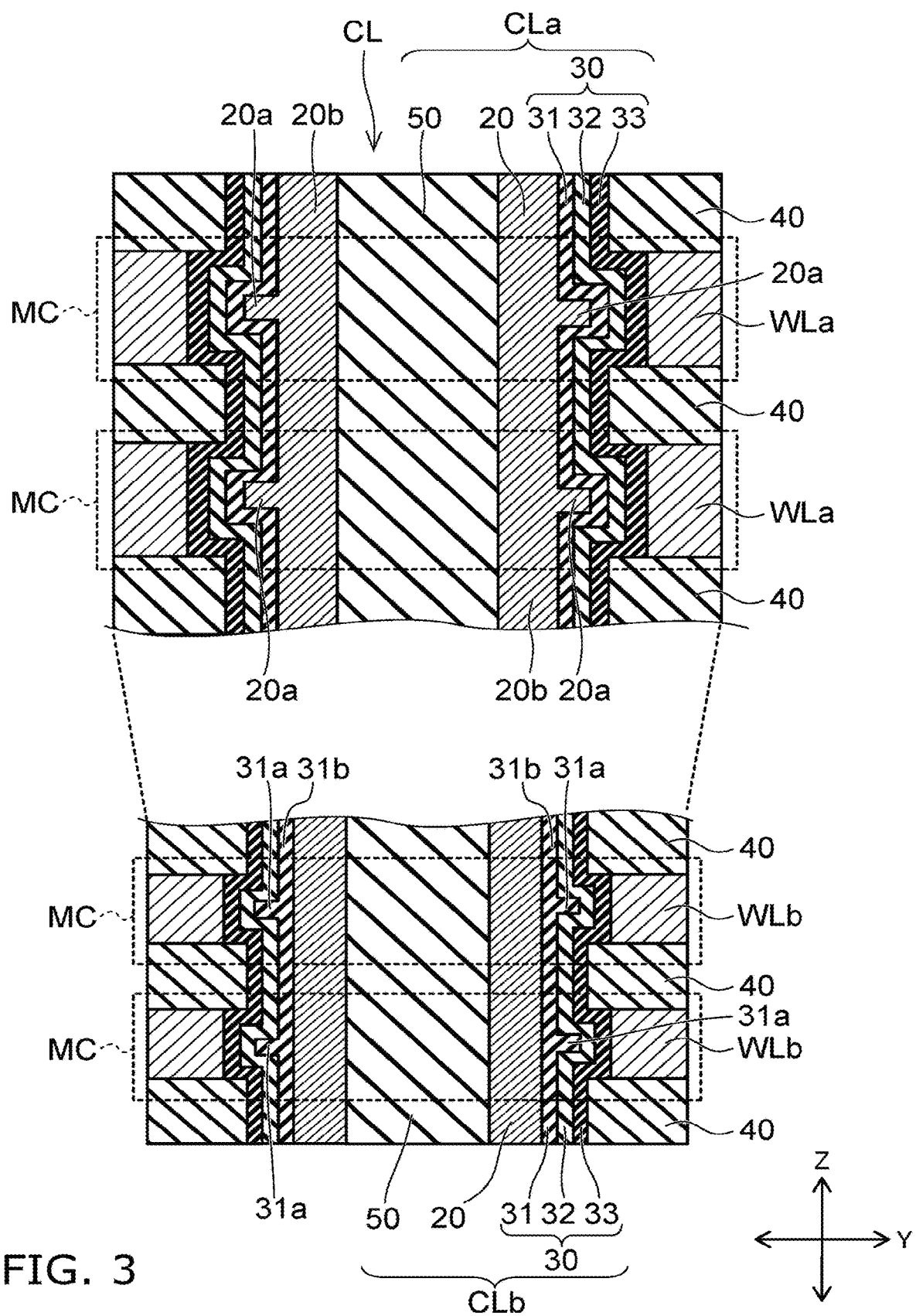
FIG. 3 is a schematic cross-sectional view of a memory cell of the semiconductor device of the embodiment.

FIG. 3 is an enlarged schematic sectional view of the first portion CLa of the columnar part CL, and the first electrode layers WLa provided around the portion CLa, and the second portion CLb of the columnar part CL, and the second electrode layers WLb provided around the portion CLb.

The first portion CLa of the columnar part CL has a memory film 30, a semiconductor body 20, and a core insulating film 50. The second portion CLb also has a memory film 30, a semiconductor body 20, and a core insulating film 50.

The semiconductor body 20 and the memory film 30 extend in pipe shapes in the Z-direction in the stacked body 100. The memory film 30 is provided between the stacked body 100 and the semiconductor body 20 and surrounds the semiconductor body 20 from the outer circumference side. The core insulating film 50 is provided inside of the semiconductor body 20.

The memory film 30 has a block insulating film 33, a charge storage film 32, and a tunnel insulating film 31. The block insulating films 33, the charge storage films 32, and the tunnel insulating films 31 are provided between the first electrode layers WLa and the semiconductor body 20, and between the second electrode layers WLb and the semiconductor body 20.

The block insulating films 33 are in contact with the first electrode layers WLa and the second electrode layers WLb, the tunnel insulating films 31 are in contact with the semiconductor bodies 20, and the charge storage films 32 are provided between the block insulating films 33 and the tunnel insulating films 31.

FIG. 3 shows e.g. two memory cells MC at the upper layer side and two memory cells MC at the lower layer side. The memory cell MC at the upper layer side has a vertical transistor structure in which the semiconductor body 20 is surrounded by the first electrode layer WLa via the memory film 30. Similarly, the memory cell MC at the lower layer side has a vertical transistor structure in which the semiconductor body 20 is surrounded by the second electrode layer WLb via the memory film 30.

The semiconductor bodies 20 function as channels of the transistors (memory cells MC) and the first electrode layers WLa and the second electrode layers WLb function as control gates. The charge storage films 32 function as data storage layers storing charge injected from the semiconductor bodies 20.

The semiconductor memory device of the embodiment is a nonvolatile semiconductor memory device that may electrically freely delete and write data and hold memory contents after power is turned off.

The memory cell MC is e.g. a charge-trap memory cell. The charge storage film 32 has many trap sites for trapping charge and includes e.g. a silicon nitride film.

The tunnel insulating film 31 serves as a potential barrier when charge is injected from the semiconductor body 20 into the charge storage film 32 or when the charge stored in the charge storage film 32 is diffused into the semiconductor body 20. The tunnel insulating film 31 includes e.g. a silicon oxide film. Or, the tunnel insulating film 31 includes a stacked film having a structure in which a silicon nitride film is interposed by a pair of silicon oxide films (ONO film). The tunnel insulating film 31 including the ONO film enables delete operation in the lower electric field in comparison to a single layer of the silicon oxide film.

The block insulating films 33 prevent diffusion of the charge stored in the charge storage films 32 into the first electrode layers WLa and the second electrode layers WLb. The block insulating film 33 includes a stacked film of e.g. a silicon oxide film and a film having higher dielectric constant than the silicon oxide film (e.g. a silicon nitride film, aluminum oxide film, hafnium oxide film, or yttrium oxide film).

As shown in FIG. 1, a drain-side select transistor STD is provided in the upper end of the columnar part CL and a source-side select transistor STS is provided in the lower end.

The memory cell MC, the drain-side select transistor STD, and the source-side select transistor STS are vertical transistors in which currents flow in the stacking direction (Z-direction) of the stacked body 100.

The drain-side select gate SGD functions as a gate electrode (control gate) of the drain-side select transistor STD. An insulating film functioning as a gate insulating film of the drain-side select transistor STD is provided between the drain-side select gate SGD and the semiconductor body 20.

The source-side select gate SGS functions as a gate electrode (control gate) of the source-side select transistor STS. An insulating film functioning as a gate insulating film of the source-side select transistor STS is provided between the source-side select gate SGS and the semiconductor body 20.

The plurality of memory cells MC with the respective electrode layers as the control gates are provided between the drain-side select transistor STD and the source-side select transistor STS. The plurality of memory cells MC, the drain-side select transistor STD, and the source-side select transistor STS are series-connected through the semiconductor body 20 and form one memory string. A plurality of the memory strings are arranged in the X-direction and the Y-direction, and thereby, the plurality of memory cells MC are three-dimensionally provided in the X-direction, the Y-direction, and the Z-direction.

Next, the separation part ST will be described.

As shown in FIG. 2, the separation part ST has a source layer SL as a conductive layer, and insulating films 63. The source layer SL is a metal layer containing e.g. tungsten or molybdenum as a major component. The source layer SL extends in the Z-direction and extends in the paper depth direction in FIG. 2 (corresponding to the X-direction in FIG. 1). The insulating films 63 are provided on both side walls of the source layer SL in the Y-direction. The insulating films 63 are provided between the source layer SL and the stacked body 100.

The separation part ST spreads like a plate in the Z-direction and the X-direction, and separates the stacked body 100 in the Y-direction.

As shown in FIG. 2, the lower end of the semiconductor body 20 and the lower end of the source layer SL are in contact with the substrate 10. The lower end of the semiconductor body 20 is electrically connected to the source layer SL via the substrate 10. The source layer SL is connected to an upper layer interconnection 80 shown in FIG. 1 provided on the stacked body 100. The upper end of the semiconductor body 20 is connected to the bit line BL shown in FIG. 1.

Next, referring to FIG. 3, the detailed structures of the memory cells MC at the upper layer side and the lower layer side will be described.

First, the structure of the memory cell MC at the upper layer side is described.

The side surface of the upper first electrode layer WLa on the block insulating film 33 side is farther from the semiconductor body 20 than the side of the insulating layer 40 on the block insulating film 33 side. The distance between the side surfaces of the first electrode layer WLa is larger than the distance between the side surfaces of the insulating layer 40. The side surfaces of the first electrode layer WLa face each other across the center axis of the columnar part CL. The side surfaces of the insulating layer 40 face each other across the center axis of the columnar part CL. Here, the center axis of the columnar part CL shows the center axis of a perfect circle when the cross section of the columnar part CL is approximated by the perfect circle. Steps are formed between the side surface of the first electrode layer WLa and the side surface of the insulating layer 40.

The block insulating film (second insulating film) 33, the charge storage film 32, and the tunnel insulating film (first insulating film) 31 are conformally provided along the steps. The block insulating film 33, the charge storage film 32, and the tunnel insulating film 31 are provided along the side surface of the insulating layer 40, the side surface of the first electrode layer WLa, and the upper and the lower surfaces of the insulating layer 40 continuing to the side surface of the insulating layer 40.

The block insulating film 33, the charge storage film 32, and the tunnel insulating film 31 are provided in concave shapes with their bottoms directed toward the side wall of the first electrode layer WLa in the sectional view shown in FIG. 3. The charge storage film 32 is provided inside of the concave-shaped block insulating film 33 and the tunnel insulating film 31 is provided inside of the concave-shaped charge storage film 32.

The semiconductor body 20 of the first portion CLa has a first semiconductor part 20b extending in the stacking direction (Z-direction) of the stacked body 100 and second semiconductor parts 20a projecting from the first semiconductor part 20b toward the first electrode layers WLa. The second semiconductor part 20a is provided between the first semiconductor part 20b and the first electrode layer WLa. The second semiconductor part 20a has an end closer to the first electrode layer WLa side than the first semiconductor part 20b. The second semiconductor part 20a is provided in a ring shape around the first semiconductor part 20b.

The first semiconductor part 20b and the second semiconductor parts 20a are formed by a silicon film that is integrally and continuously provided. The second semiconductor parts 20a are provided inside of the concave-shaped tunnel insulating film 31 and opposed to the first electrode layers WLa via the tunnel insulating film 31, the charge storage film 32, and the block insulating film 33.

Next, the structure of the memory cell MC at the lower layer side will be described.

The side surface of the lower second electrode layer WLb on the block insulating film 33 side is also farther from the semiconductor body 20 than the side of the insulating layer 40 on the block insulating film 33 side, like the first electrode layer WLa. The distance between the side surfaces of the second electrode layer WLb is larger than the distance between the side surfaces of the insulating layer 40. The side surfaces of the second electrode layer WLb faces each other across the center axis of the columnar part CL. The side surfaces of the insulating layer 40 faces each other across the center axis of the columnar part CL. Steps are formed between the side surface of the second electrode layer WLb and the side surface of the insulating layer 40.

The block insulating film 33 and the charge storage film 32 are conformally provided along the steps. The block insulating film 33 and the charge storage film 32 are provided along the side surface of the insulating layer 40, the side surface of the second electrode layer WLb, and the upper and the lower surfaces of the insulating layer 40 continuing to the side surface of the insulating layer 40.

The block insulating film 33 and the charge storage film 32 are provided in concave shapes with their bottoms directed toward the side wall of the second electrode layer WLb in the sectional view shown in FIG. 3. The charge storage film 32 is provided inside of the concave-shaped block insulating film 33.

The tunnel insulating film 31 of the second portion CLb has a first insulating part 31b extending in the stacking direction (Z-direction) of the stacked body 100 and second insulating parts 31a projecting from the first insulating part 31b toward the second electrode layers WLb. The second insulating part 31a is provided between the first insulating part 31b and the second electrode layer WLb. The second insulating part 31a has an end closer to the second electrode layer WLb side than the first insulating part 31b. The second insulating part 31a is provided in a ring shape around the first insulating part 31b.

The first insulating part 31b and the second insulating parts 31a are integrally and continuously provided. The second insulating parts 31a are provided inside of the concave-shaped charge storage film 32 and opposed to the second electrode layers WLb via the charge storage film 32 and the block insulating film 33.

The second electrode layer WLb is thinner than the first electrode layer WLa. The distance between the insulating layers 40 (the distance in the Z-direction) in the part in which the side surface of the second electrode layer WLb is farther from the semiconductor body 20 than the side surface of the insulating layer 40, is smaller than the distance between the insulating layers 40 in the part in which the side surface of the first electrode layer WLa is farther from the semiconductor body 20 than the side surface of the insulating layer 40.

The distance between inner walls (the distance in the Z-direction) of the concave-shaped charge storage film 32 formed in the part in which the side surface of the second electrode layer WLb is farther from the semiconductor body 20 than the side surface of the insulating layer 40, is smaller than the distance between inner walls (the distance in the Z-direction) of the concave-shaped charge storage film 32 formed in the part in which the side surface of the first electrode layer WLa is farther from the semiconductor body 20 than the side surface of the insulating layer 40.

Therefore, the tunnel insulating film 31 of the first portion CLa is conformally formed along the inner wall of the concave-shaped charge storage film 32. On the other hand, the tunnel insulating film 31 fills the interior of the concave-shaped charge storage film 32 of the second portion CLb and serves as the convex-shaped second insulating part 31a.

The thickness of the part in which the second insulating part 31a of the tunnel insulating film 31 is provided in the second portion CLb in a direction connecting the second electrode layer WLb and the semiconductor body 20 (Y-direction), is larger than the thickness of the tunnel insulating film 31 of the first portion CLa. The thickness of the tunnel insulating film 31 in the part opposed to the second electrode layer WLb (the thickness of the second insulating part 31a in the Y-direction), is larger than the thickness of the tunnel insulating film 31 between the second semiconductor part 20a of the semiconductor body 20 of the first portion CLa and the first electrode layer WLa.

Next, referring to FIGS. 4 to 7, a method for manufacturing the semiconductor memory device of the embodiment will be described.

Figure 4:
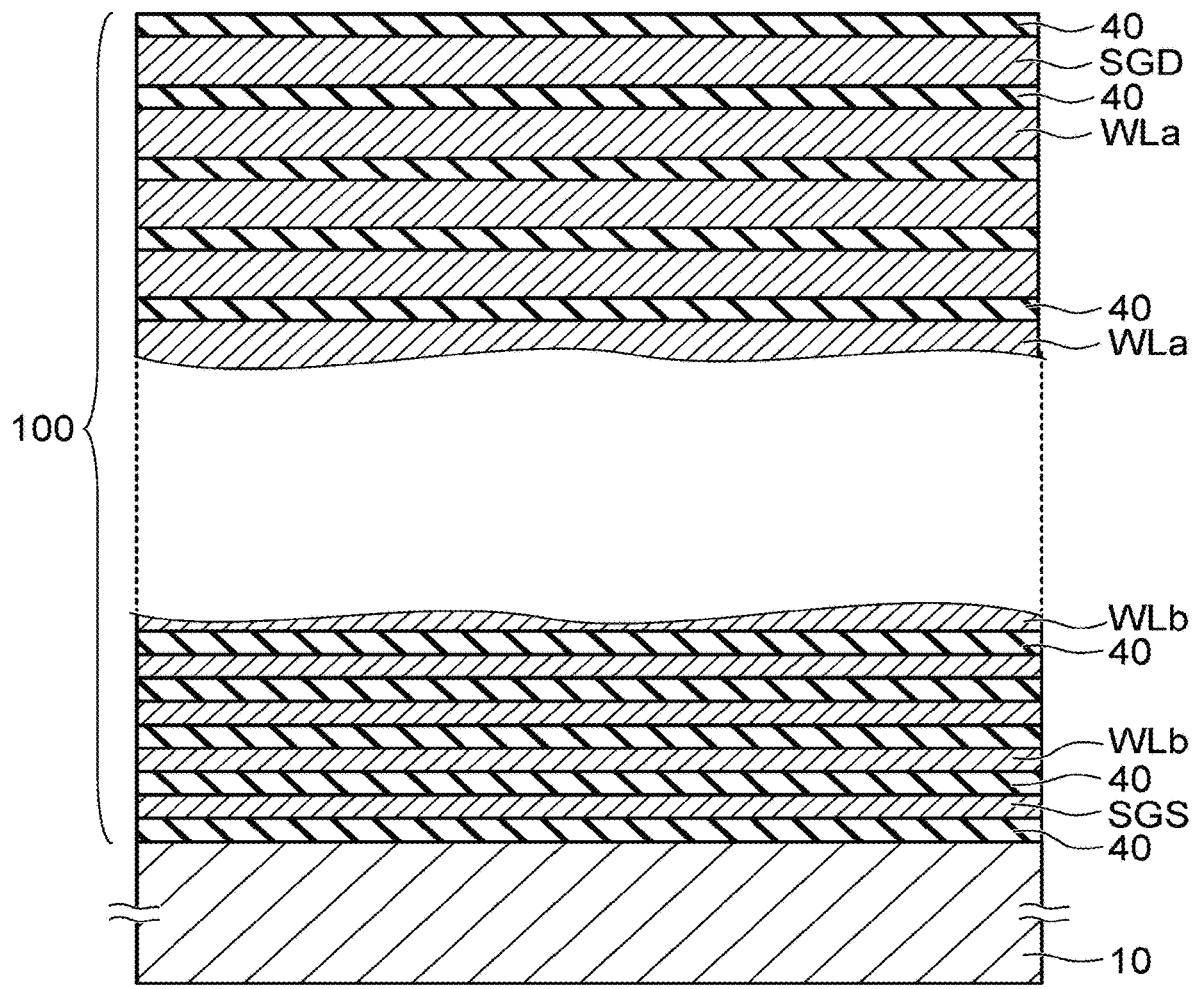
FIGS. 4 to 7 are schematic cross-sectional views showing a method for manufacturing the semiconductor device of the embodiment.

As shown in FIG. 4, the stacked body 100 is formed on the substrate 10. The stacked body 100 has the source-side select gate SGS, the plurality of second electrode layers WLb, the plurality of first electrode layers WLa, the plurality of insulating layers 40, and the drain-side select gate SGD. The substrate 10 is e.g. a semiconductor substrate and silicon substrate. The thickness of the first electrode layer WLa at the upper layer side is larger than the thickness of the second electrode layer WLb at the lower layer side.

Figure 5:
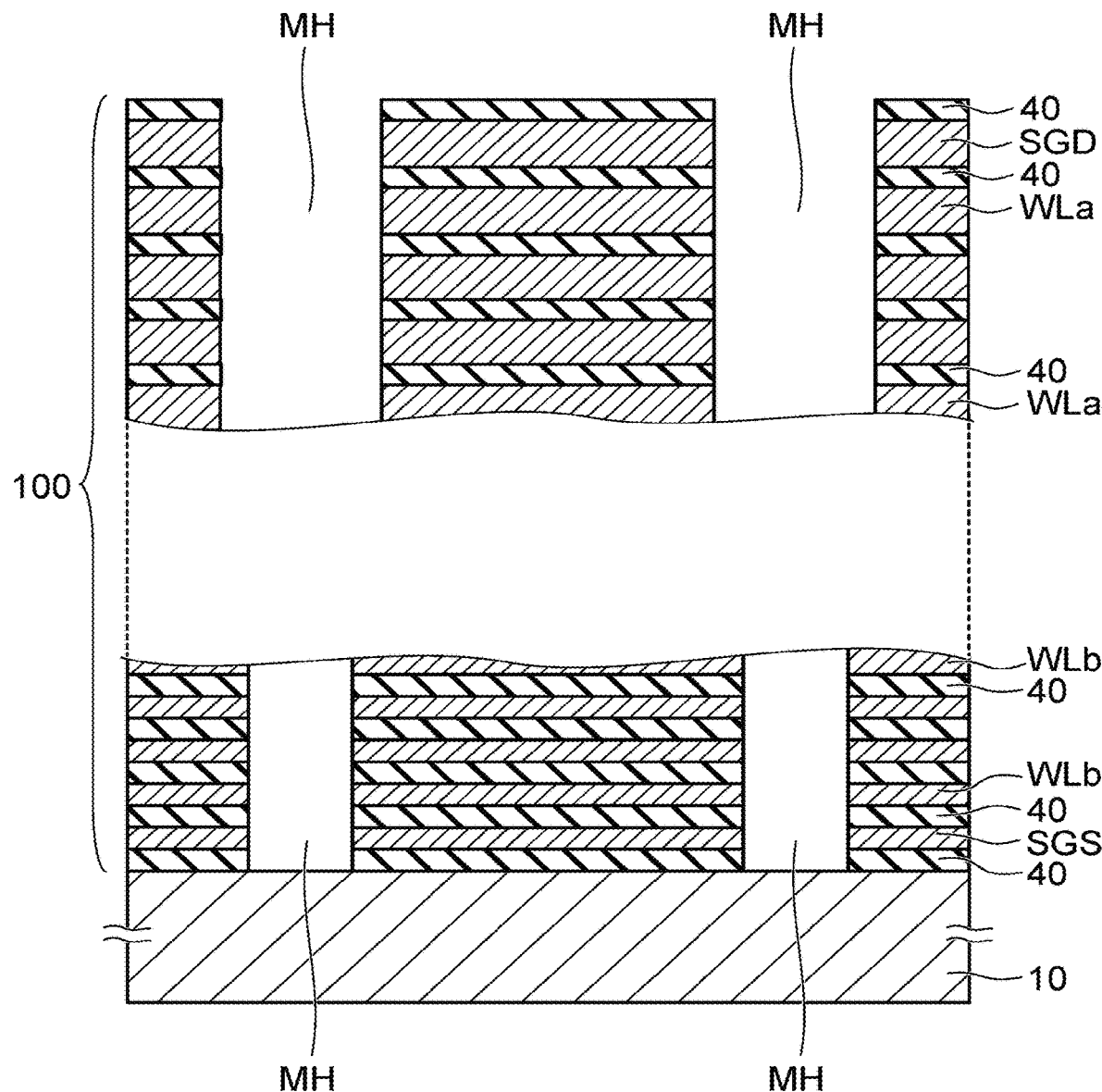

As shown in FIG. 5, the plurality of memory holes MH are formed in the stacked body 100. For instance, the stacked body 100 is etched by Reactive Ion Etching (RIE) using a mask (not shown), and the memory holes MH are formed. The bottoms of the memory holes MH reach the substrate 10. The diameter of the memory hole MH on the bottom side is smaller than that on the top side.

Then, the side walls of the conductive layers (first electrode layers WLa, WLb and the select gates SGS, SGD) exposed in the memory holes MH are receded by isotropic etching through the memory holes MH. The side walls of the conductive layers surrounding the memory holes MH are receded away from the memory holes MH in the radial direction of the memory holes MH.

Figure 6:
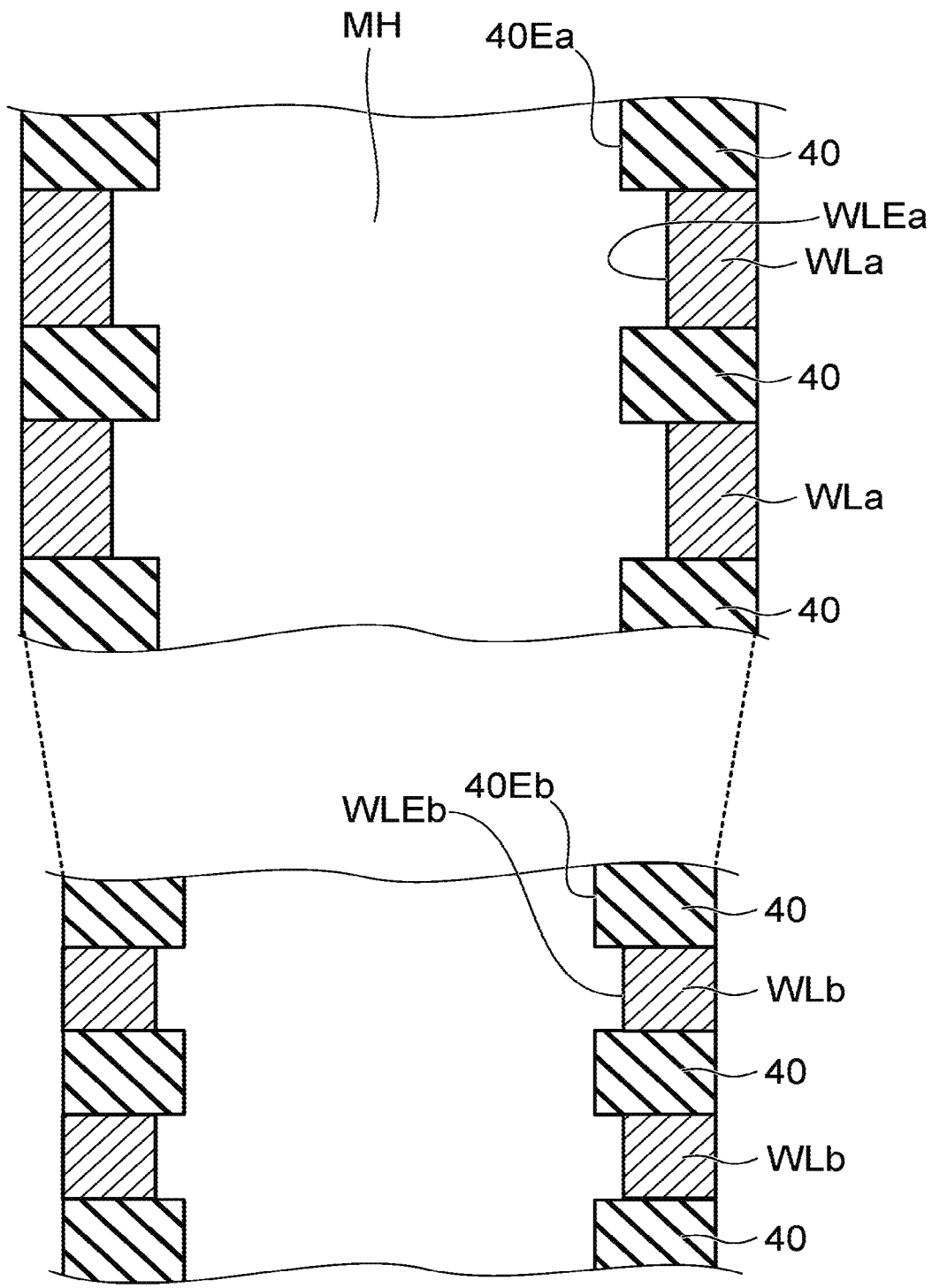

FIG. 6 shows an enlarged schematic section of the upper layer side part in which the first electrode layers WLa are receded and the lower layer side part in which the second electrode layers WLb are receded.

By the recession of the first electrode layers WLa, steps are formed between side walls WLEa of the first electrode layers WLa on the memory hole MH side and side walls 40Ea of the insulating layers 40 on the memory hole MH side. The side walls 40Ea of the insulating layers 40 project toward the memory hole MH further than the side walls WLEa of the first electrode layers WLa.

Similarly, by the recession of the second electrode layers WLb, steps are formed between side walls WLEb of the second electrode layers WLb on the memory hole MH side and side walls 40Eb of the insulating layers 40 on the memory hole MH side. The side walls 40Eb of the insulating layers 40 project toward the memory hole MH further than the side walls WLEb of the second electrode layers WLb.

Figure 7:
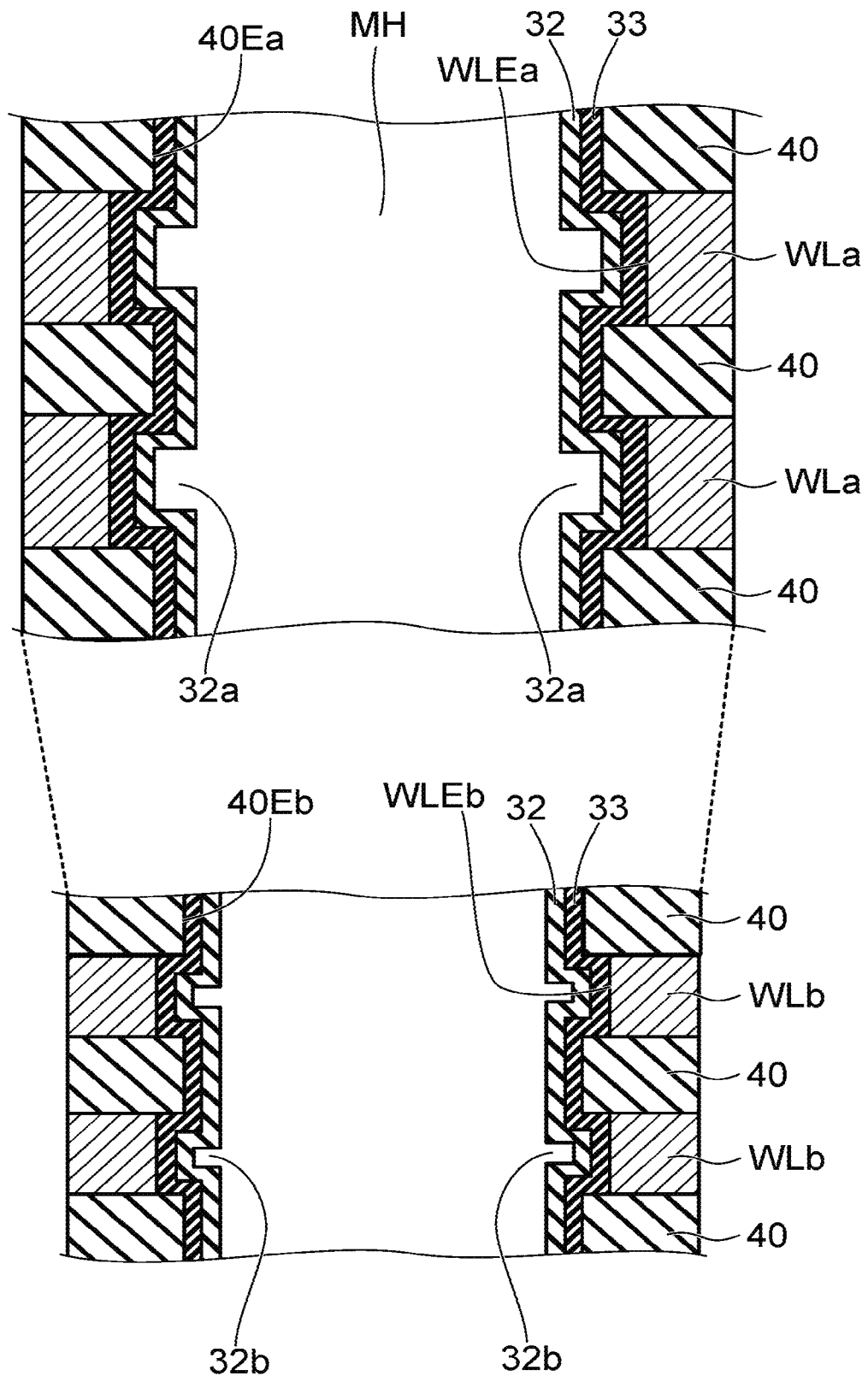

As shown in FIG. 7, the block insulating film 33 is conformally formed along the steps of the side walls WLEa of the first electrode layers WLa and the side walls 40Ea of the insulating layers 40. The block insulating film 33 covers the end parts projecting further than the side walls WLEa of the first electrode layers WLa and the first electrode layers WLa of the insulating layers 40.

The block insulating film 33 is conformally formed along the steps of the side walls WLEb of the second electrode layers WLb and the side walls 40Eb of the insulating layers 40. The block insulating film 33 covers the end parts projecting further than the side walls WLEb of the second electrode layers WLb and the second electrode layers WLb of the insulating layers 40.

In the sectional view shown in FIG. 7, the block insulating films 33 are formed in concave shapes with their bottoms directed toward the first electrode layer WLa side and the second electrode layer WLb side.

The charge storage films 32 are formed inside of the concave-shaped block insulating films 33. The charge storage films 32 are also formed in concave shapes along the concave-shaped inner walls of the block insulating films 33.

The insulating layers 40 have end parts projecting toward the center axis side of the memory hole MH further than the side walls of the electrode layers WLa, WLb.

The first electrode layer WLa is thicker than the second electrode layer WLb, and the distance between the end parts of the two insulating layers 40 provided on the top and the bottom of the first electrode layer WLa is larger than the distance between the end parts of the two insulating layers 40 provided on the top and the bottom of the second electrode layer WLb.

As shown in FIG. 7, regions 32a exist between the charge storage film 32 formed in the concave shape in positions opposed to the first electrode layers WLa and the memory hole MH. Regions 32b exist between the charge storage film 32 formed in the concave shape in positions opposed to the second electrode layers WLb and the memory hole MH. The height of the region 32a is larger than the height of the region 32b.

Therefore, the region 32a is not completely filled with the tunnel insulating film 31 and the tunnel insulating film 31 is formed in a concave shape along the inner wall of the charge storage film 32 in the region 32a as shown in FIG. 3. A space is left inside of the concave-shaped charge storage film 32 and a part of the semiconductor body 20 is formed as the second semiconductor part 20a in the space.

On the other hand, the region 32b having the smaller height than the region 32a (shown in FIG. 7) is filled with a part of the tunnel insulating film 31 as shown in FIG. 3. The part of the tunnel insulating film 31 is formed as the second insulating part 31a in the region 32b and the tunnel insulating film 31 is not formed in a concave shape. The side surface of the tunnel insulating film 31 opposite to the charge storage film 32 is formed along the stacking direction of the stacked body 100. The semiconductor body 20 formed on the side wall of the tunnel insulating film 31 does not form a convex part, but is formed along the stacking direction.

As shown in FIG. 5, the memory hole MH is formed by collectively etching the plurality of electrode layers including the first electrode layers WLa and the second electrode layers WLb and the plurality of insulating layers 40. Particularly, when the number of electrode layers is larger and the aspect ratio of the memory hole MH is higher, in the RIE technology, it tends to be harder to make the hole diameters uniform from the upper layers to the lower layers of the stacked body 100. In many cases, the hole diameter is larger in the upper layers and the hole diameter is smaller in the lower layers.

Accordingly, the columnar part CL provided in the memory hole MH is formed in a shape having an upper portion (first portion CLa) and a lower portion (second portion CLb) in the smaller diameter than that of the upper portion.

An electric field (tunnel field) is likely to be applied to the tunnel insulating film 31 in the second portion CLb having the smaller diameter than the first portion CLa. Accordingly, with respect to the memory cells MC at the lower layer side, erroneous writing and erroneous reading due to application of a stronger electric field than a desired electric field may be caused.

On the other hand, an electric field (tunnel field) is unlikely to be applied to the tunnel insulating film 31 in the first portion CLa having the larger diameter than the second portion CLb. Accordingly, with respect to the memory cells MC at the upper layer side, writing failure and deletion failure due to application of a weaker electric field than a desired electric field may be caused.

According to the above described embodiment, the convex-shaped second semiconductor part 20a opposed to the first electrode layer WLa is provided in the semiconductor body 20 of the first portion CLa in the larger diameter of the columnar part CL. A stronger electric field is applied to the second semiconductor part 20a than the flat-shaped channel (semiconductor body 20) opposed in parallel to the side wall of the first electrode layer WLa, and the writing and deletion characteristics may be improved and the writing failure and deletion failure may be suppressed.

On the other hand, a thicker part (second insulating part 31a) of the tunnel insulating film 31 is provided in the second portion CLb in the smaller diameter of the columnar part CL. The thicker part exists in the tunnel insulating film 31 in a direction connecting the second electrode layer WLb and the semiconductor body 20. The thicker part of the tunnel insulating film 31 relaxes the electric field applied to the tunnel insulating film 31 and suppresses erroneous writing. Further, the second electrode layer WLb thinner than the first electrode layer WLa relaxes a writing electric field applied to the memory cell MC.

Figure 8:
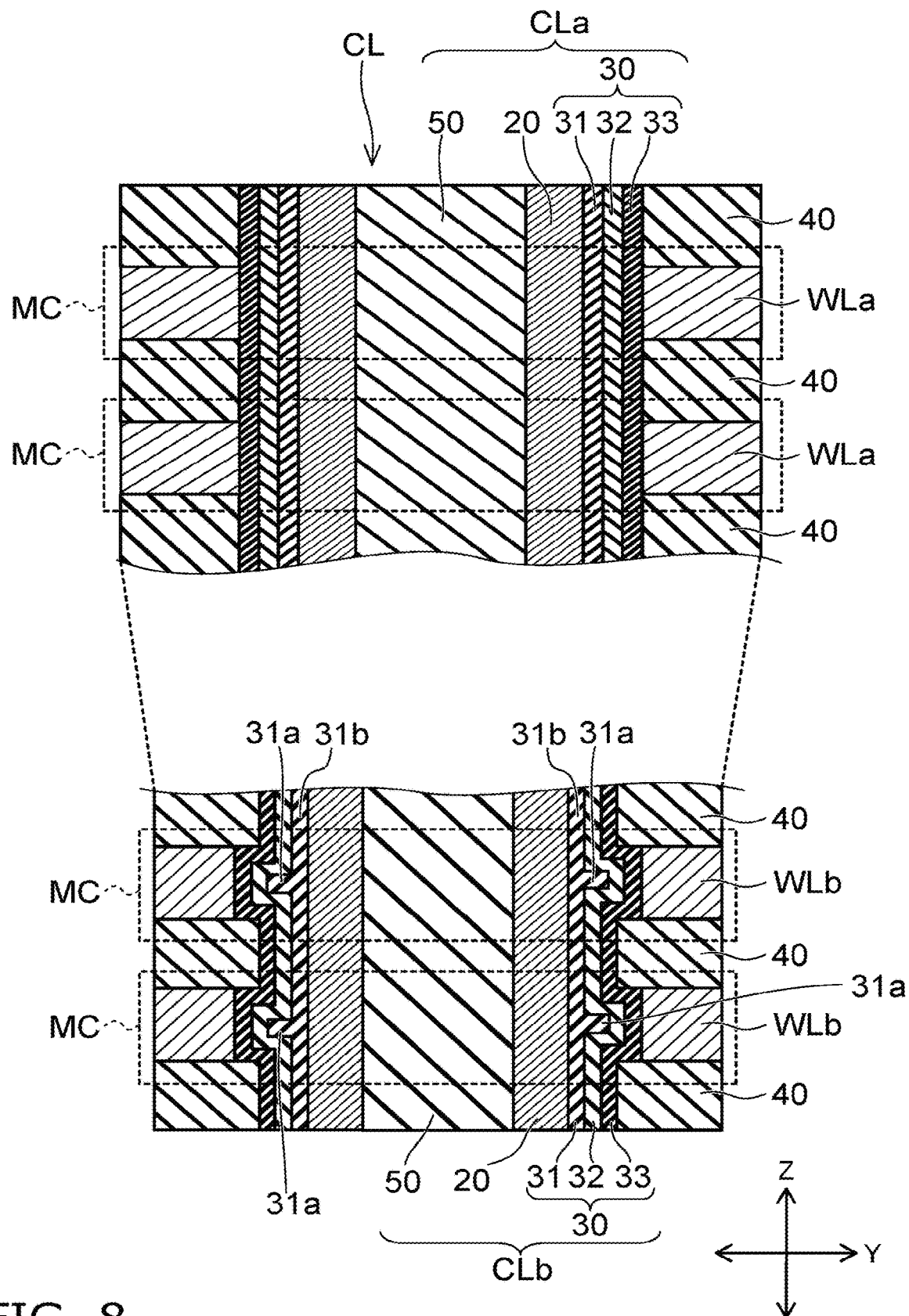
FIG. 8 is a schematic cross-sectional view of a memory cell of a semiconductor device of another embodiment.

FIG. 8 is an enlarged schematic sectional view of a memory cell of another embodiment similar to FIG. 3.

The first portion CLa of the columnar part CL is provided at the upper side of the center part in the stacking direction (Z-direction) of the stacked body 100. The second portion CLb of the columnar part CL is provided at the lower side of the center part of the stacking direction of the stacked body 100 (at the substrate 10 side). The diameter of the second portion CLb is smaller than the diameter of the first portion CLa.

The first electrode layer WLa is contiguous to the first portion CLa and surrounds the first portion CLa. The second electrode layer WLb is contiguous to the second portion CLb and surrounds the second portion CLb. The thickness of the first electrode layer WLa is nearly equal to the thickness of the second electrode layer WLb.

First, the first portion CLa at the upper layer side is described.

The side surface of the first electrode layer WLa on the block insulating film 33 side and the side surface of the insulating layer 40 on the block insulating film 33 side hardly form steps and extend along the stacking direction of the stacked body 100.

The distance between the side surfaces of the first electrode layer WLa, and the distance between the side surfaces of the insulating layers 40 provided on the top and bottom of the first electrode layer WLa are nearly equal. The side surfaces of the first electrode layer WLa face each other across the center axis of the columnar part CL. The side surfaces of the insulating layers 40 face each other across the center axis of the columnar part CL.

The block insulating film 33, the charge storage film 32, the tunnel insulating film 31, and the semiconductor body 20 extend in the stacking direction of the stacked body 100 along the side surfaces of the first electrode layers WLa and the side surfaces of the insulating layer 40. No convex parts are formed in the films.

Next, the second portion CLb at the lower layer side is described.

The side surface of the lower second electrode layer WLb on the block insulating film 33 side is farther away from the semiconductor body 20 than the side surfaces of the insulating layers 40 provided on the top and bottom of the second electrode layer WLb. The distance between the side surfaces of the second electrode layer WLb is larger than the distance between the side surfaces of the insulating layer 40. The side surfaces of the second electrode layer WLb face each other across the center axis of the columnar part CL. The side surfaces of the insulating layer 40 face each other across the center axis of the columnar part CL.

Steps are formed between the side surface of the second electrode layer WLb and the side surface of the insulating layer 40.

The block insulating film 33 and the charge storage film 32 are conformally provided along the steps. The block insulating film 33 and the charge storage film 32 are provided in concave shapes with their bottoms directed toward the side surface of the second electrode layer WLb in the sectional view shown in FIG. 8. The charge storage film 32 is provided inside of the concave-shaped block insulating film 33.

The tunnel insulating film 31 of the second portion CLb has a first insulating part 31b extending along the stacking direction of the stacked body 100 and second insulating parts 31a having convex shapes and projecting from the first insulating part 31b toward the second electrode layers WLb.

The second insulating part 31a is provided between the first insulating part 31b and the second electrode layer WLb. The second insulating part 31a has an end closer to the second electrode layer WLb side than the first insulating part 31b. The second insulating part 31a is provided in a ring shape around the first insulating part 31b.

The first insulating part 31b and the second insulating parts 31a are integrally and continuously provided. The second insulating parts 31a are provided inside of the concave-shaped charge storage film 32 and opposed to the second electrode layers WLb via the charge storage film 32 and the block insulating film 33. The tunnel insulating film 31 fills the interior of the concave-shaped charge storage film 32 of the second portion CLb and serves as the convex-shaped second insulating parts 31a.

The thickness of the part in which the second insulating part 31a of the tunnel insulating film 31 is provided in a direction connecting the second electrode layer WLb and the semiconductor body 20 (Y-direction), is larger than the thickness of the tunnel insulating film 31 of the first portion CLa. The thickness of the tunnel insulating film 31 in the part opposed to the second electrode layer WLb (the thickness of the second insulating part 31a in the Y-direction), is larger than the thickness of the tunnel insulating film 31 between the second semiconductor part 20a of the semiconductor body 20 of the first portion CLa and the first electrode layer WLa.

According to the embodiment shown in FIG. 8, a thicker part (second insulating part 31a) of the tunnel insulating film 31 is provided in the second portion CLb in the smaller diameter of the columnar part CL. The thicker part exists in the tunnel insulating film 31 in a direction connecting the second electrode layer WLb and the semiconductor body 20. The thicker part of the tunnel insulating film 31 relaxes the electric field applied to the tunnel insulating film 31 and suppresses erroneous writing.

Figure 9:
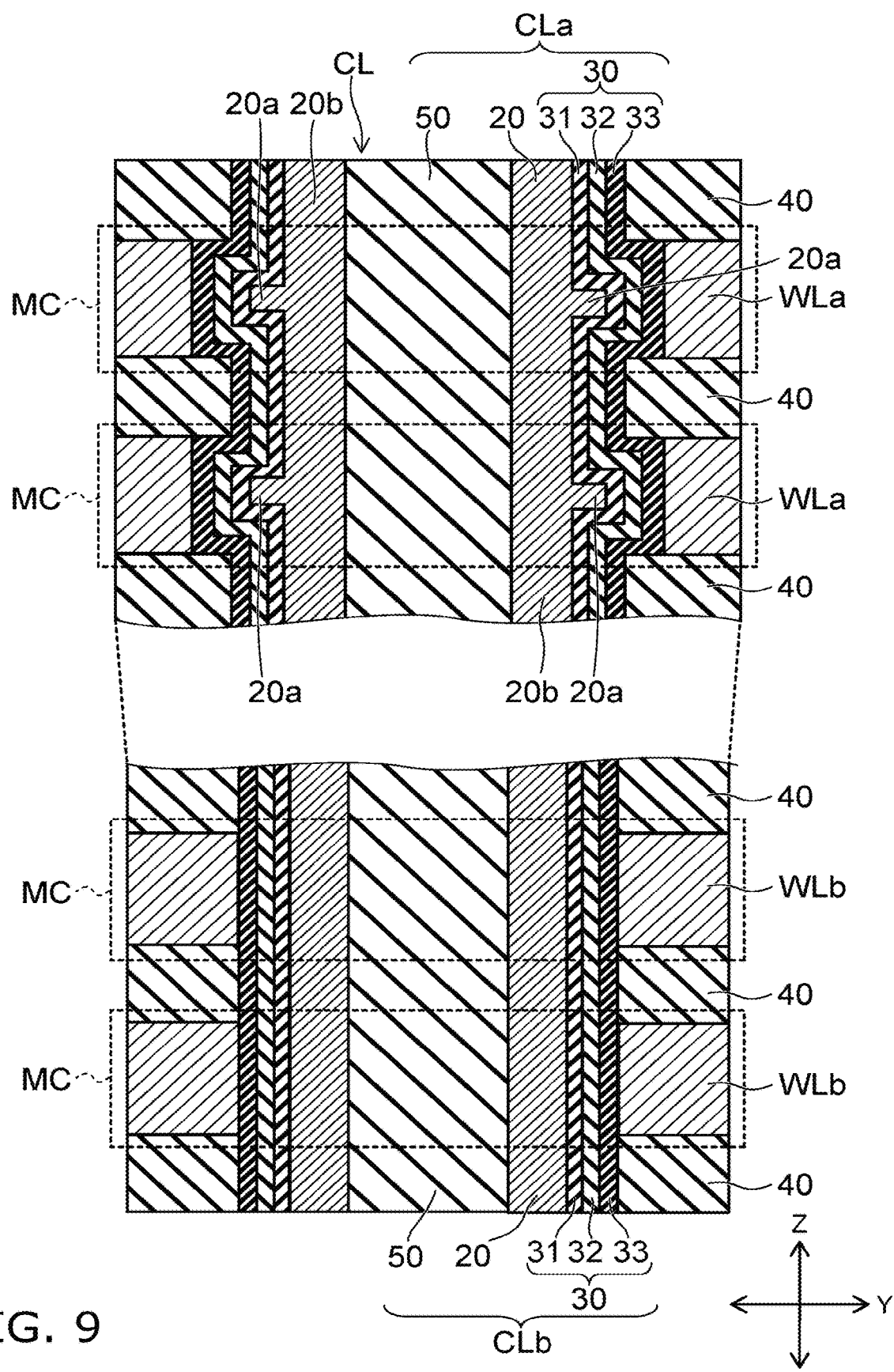
FIG. 9 is a schematic cross-sectional view of a memory cell of a semiconductor device of still another embodiment.

FIG. 9 is an enlarged schematic sectional view of a memory cell of still another embodiment similar to FIG. 3.

The first portion CLa of the columnar part CL is provided at the upper side of the center part in the stacking direction (Z-direction) of the stacked body 100. The second portion CLb of the columnar part CL is provided at the lower side of the center part in the stacking direction of the stacked body 100 (at the substrate 10 side). The diameter of the second portion CLb is smaller than the diameter of the first portion CLa.

The first electrode layer WLa is contiguous to the first portion CLa and surrounds the first portion CLa. The second electrode layer WLb is contiguous to the second portion CLb and surrounds the second portion CLb. The thickness of the first electrode layer WLa and the second electrode layer WLb are nearly equal.

First, the first portion CLa at the upper layer side is described.

The side surface of the first electrode layer WLa on the block insulating film 33 side is farther from the semiconductor body 20 than the side surfaces of the insulating layers 40 provided on the top and bottom of the first electrode layer WLa. The distance between the side surfaces of the first electrode layer WLa is larger than the distance between the side surfaces of the insulating layer 40. The side surfaces of the first electrode layer WLa face each other across the center axis of the columnar part CL. The side surfaces of the insulating layer 40 face each other across the center axis of the columnar part CL.

Steps are formed between the side surface of the first electrode layer WLa and the side surface of the insulating layer 40.

The block insulating film 33, the charge storage film 32, and the tunnel insulating film 31 are conformally provided along the steps.

The block insulating film 33, the charge storage film 32, and the tunnel insulating film 31 are provided in concave shapes with their bottoms directed toward the side surface of the first electrode layer WLa in the sectional view shown in FIG. 9. The charge storage film 32 is provided inside of the concave-shaped block insulating film 33 and the tunnel insulating film 31 is provided inside of the concave-shaped charge storage film 32.

The semiconductor body 20 of the first portion CLa has a first semiconductor part 20b extending in the stacking direction (Z-direction) of the stacked body 100 and concave-shaped second semiconductor parts 20a projecting from the first semiconductor part 20b toward the first electrode layers WLa.

The second semiconductor part 20a is provided between the first semiconductor part 20b and the first electrode layer WLa. The second semiconductor part 20a has an end closer to the first electrode layer WLa side than the first semiconductor part 20b. The second semiconductor part 20a is provided in a ring shape around the first semiconductor part 20b.

The first semiconductor part 20b and the second semiconductor parts 20a are formed by a silicon film that is integrally and continuously provided. The second semiconductor parts 20a are provided inside of the tunnel insulating film 31 and opposed to the first electrode layers WLa via the tunnel insulating film 31, the charge storage film 32, and the block insulating film 33.

Next, the second portion CLb at the lower layer side is described.

The side surface of the second electrode layer WLb on the block insulating film 33 side and the side surface of the insulating layer 40 on the block insulating film 33 hardly form steps and extend along the stacking direction of the stacked body 100.

The distance between the side surfaces of the second electrode layer WLb, and the distance between the side surfaces of the insulating layer 40 provided on the top and bottom of the second electrode layer WLb are nearly equal. The side surfaces of the second electrode layer WLb face each other across the center axis of the columnar part CL. The side surfaces of the insulating layer 40 face each other across the center axis of the columnar part CL.

The block insulating film 33, the charge storage film 32, the tunnel insulating film 31, and the semiconductor body 20 extend in the stacking direction of the stacked body 100 along the side surfaces of the second electrode layers WLb and the side surfaces of the insulating layer 40. No convex parts are formed in the films.

The convex-shaped second semiconductor part 20a opposed to the first electrode layer WLa is provided in the semiconductor body 20 of the first portion CLa in the larger diameter of the columnar part CL. A stronger electric field is applied to the second semiconductor part 20a than the flat-shaped channel (semiconductor body 20) opposed in parallel to the side wall of the first electrode layer WLa, and the writing and deletion characteristics may be improved and the writing failure and deletion failure may be suppressed.

Figure 10:
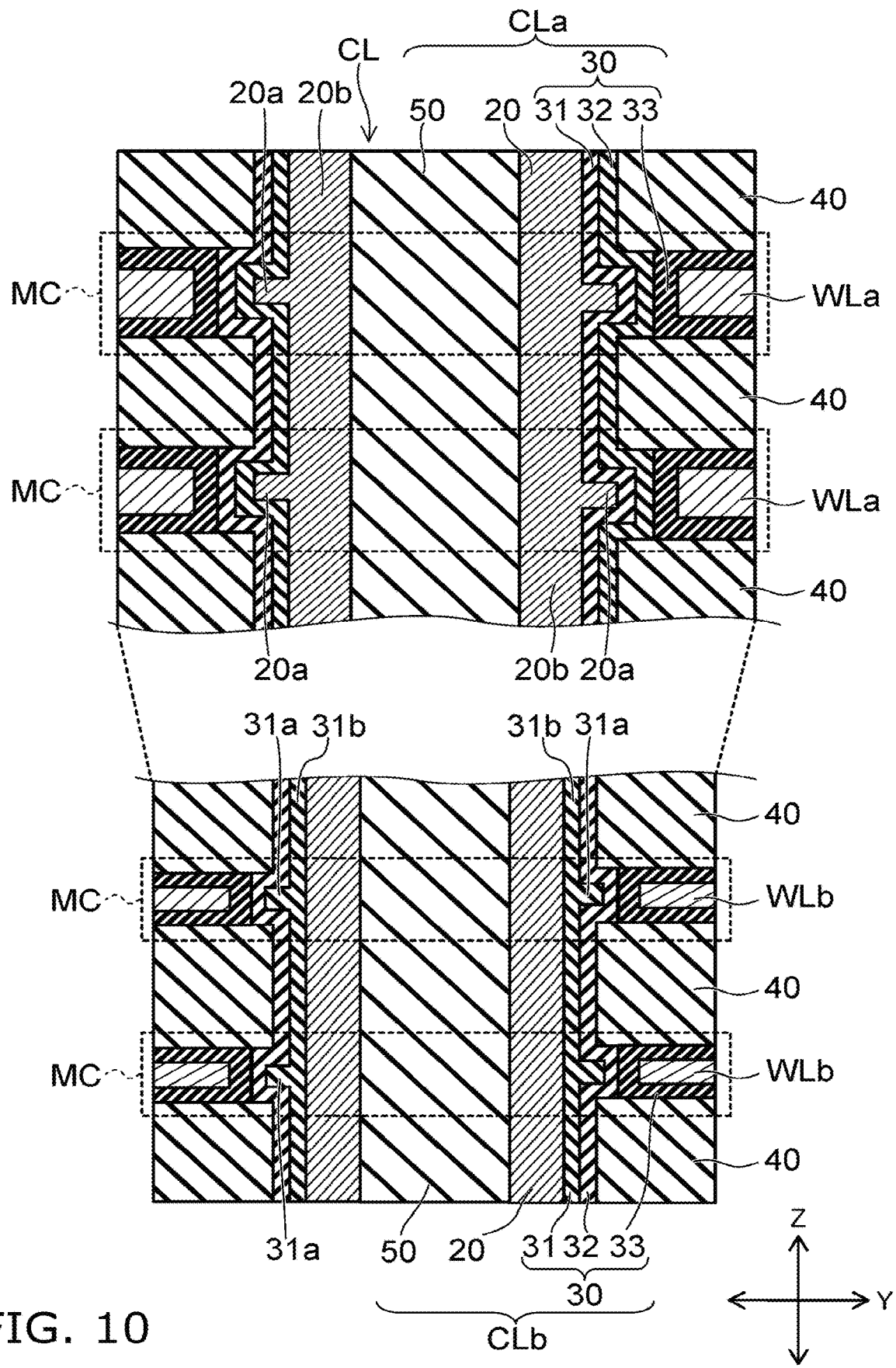
FIG. 10 is a schematic cross-sectional view of a memory cell of a semiconductor device of still another embodiment.

Next, FIG. 10 is an enlarged schematic sectional view of a memory cell of still another embodiment similar to FIG. 3.

The memory cell MC of the embodiment shown in FIG. 10 is different from the memory cell MC of the embodiment shown in FIG. 3 in that the block insulating films 33 are provided between the first electrode layers WLa and the insulating layers 40, and the second electrode layers WLb and the insulating layers 40.

The block insulating film 33 is provided integrally and continuously on the side surface, the upper surface, and the lower surface of the first electrode layer WLa. The block insulating film 33 is provided integrally and continuously on the side surface, the upper surface, and the lower surface of the second electrode layer WLb.

The rest of the configuration is the same as that of the embodiment shown in FIG. 3, and a stronger electric field is applied to the concave-shaped second semiconductor part 20a of the semiconductor body 20 than the flat-shaped channel (semiconductor body 20) opposed in parallel to the side wall of the first electrode layer WLa, and the writing and deletion characteristics may be improved and the writing failure and deletion failure may be suppressed.

Further, a thicker part (second insulating part 31a) exists in the tunnel insulating film 31 in a direction connecting the second electrode layer WLb and the semiconductor body 20, and the thicker part of the tunnel insulating film 31 relaxes the electric field applied to the tunnel insulating film 31 and suppresses erroneous writing.

The structure in FIG. 10 may be formed in the following manner.

A stacked body 100 having a plurality of sacrifice layers (first layers) and a plurality of insulating layers (second layers) 40 is formed. The sacrifice layers and the insulating layers 40 are alternately stacked on a substrate 10. For instance, the sacrifice layers are silicon nitride films, and the insulating layers 40 are silicon oxide films.

Figure 11:
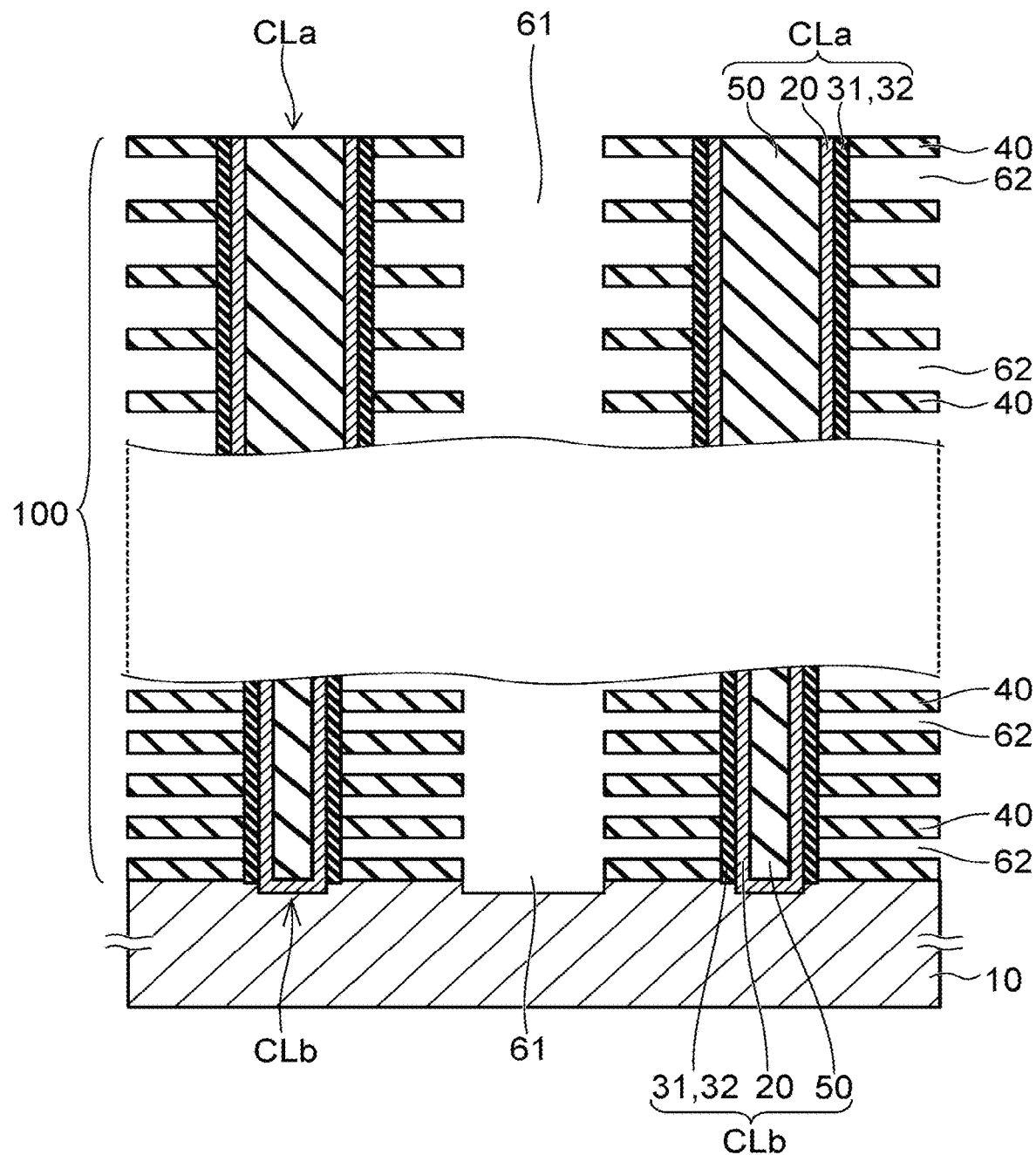
FIG. 11 is a schematic cross-sectional view showing a method for manufacturing the semiconductor device shown in FIG. 10.

Memory holes are formed in the stacked body 100, and then, charge storage films 32, tunnel insulating films 31, and semiconductor bodies 20 are sequentially formed on the side walls of the memory holes. Core insulating films 50 are formed inside of the semiconductor bodies 20. After the formation of those films, slits for formation of separation parts ST are formed in the stacked body 100. As shown in FIG. 11, a slit 61 penetrates the stacked body 100 and reaches the substrate 10.

The sacrifice layers are removed by etching through the slit 61. By removal of the sacrifice layers, spaces 62 are formed between the insulating layers 40. The block insulating films 33 are conformally formed on inner walls of the spaces through the slit 61. Inside of the conformally formed block insulating films 33, electrode layers WL are formed through the slit 61.

Insulating films 63 shown in FIG. 2 are formed on side walls of the slit 61, and source layers SL are formed inside of the insulating films 63.

According to the above described respective embodiments, differences in tunnel electric field due to differences in memory hole diameter (columnar part diameter) between the memory cells MC at the upper layer side and the memory cells MC at the lower layer side may be relaxed, and erroneous operation may be suppressed and reliability may be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
    a stacked body including a plurality of electrode layers stacked with an insulator interposed, a source-side select gate layer provided below the electrode layers, and a drain-side select gate layer provided above the electrode layers;
    a semiconductor body extending in a stacking direction of the stacked body through the electrode layers and having a pipe shape, a plurality of memory cells being provided at intersecting portions of the semiconductor body with the electrode layers; and
    a columnar insulating member extending in the stacking direction inside the semiconductor body having the pipe shape, the columnar insulating member being formed as one body inside an intersecting portion of the semiconductor body with a lowermost electrode layer of the electrode layers and inside an intersecting portion of the semiconductor body with the source-side select gate layer, the electrode layers including a first electrode layer disposed in a first level in the stacking direction and a second electrode layer disposed in a second level in the stacking direction, one of the first level and the second level being located farther from the source-side select gate layer than the other of the first level and the second level while the other of the first level and the second level being located farther from the drain-side select gate layer than the one of the first level and the second level, the insulator including a first insulator contiguous above the first electrode layer, a second insulator contiguous below the first electrode layer, a third insulator contiguous above the second electrode layer, and a fourth insulator contiguous below the second electrode layer, the first electrode layer being interposed between the first insulator and the second insulator, the second electrode layer being interposed between the third insulator and the fourth insulator, an outer periphery of the semiconductor body having a first outer periphery facing to the first insulator, a second outer periphery facing to the second insulator, a first base surface facing to the first electrode layer, a third outer periphery facing to the third insulator, a fourth outer periphery facing to the fourth insulator, and a second base surface facing to the second electrode layer, the first base surface being disposed between the first outer periphery and the second outer periphery and being defined by a surface substantially aligned in the stacking direction with the first outer periphery and the second outer periphery, the second base surface being disposed between the third outer periphery and the fourth outer periphery and being defined by a surface substantially aligned in the stacking direction with the third outer periphery and the fourth outer periphery, a diameter of the columnar insulating member at the first level being larger than a diameter of the columnar insulating member at the second level, a distance between the first base surface and the first electrode layer being larger than a distance between the second base surface and the second electrode layer.

2. The device according to claim 1, wherein the semiconductor body and the columnar insulating member are provided in a hole extending in the stacking direction through the stacked body and a stacked film is provided between the electrode layers and the semiconductor body in the hole.

3. The device according to claim 2, wherein the stacked film includes a silicon oxide film on a side of the semiconductor body and a silicon nitride film between the silicon oxide film and the electrode layers.

4. The device according to claim 1, wherein the memory cells include a tunnel insulating film, a charge storage film, and a block insulating film stacked at the intersecting portions in order on the outer periphery of the semiconductor body.

5. The device according to claim 4, wherein the block insulating film includes a silicon oxide film and a film having higher dielectric constant than the silicon oxide film.

6. The device according to claim 1, wherein the memory cells include a tunnel insulating film formed along the outer periphery of the semiconductor body, the tunnel insulating film extending in the stacking direction between the semiconductor body and the second electrode layer, between the semiconductor body and the third insulator, and between the semiconductor body and the fourth insulator.

7. The device according to claim 1, wherein the distance between the first base surface and the first electrode layer is larger than a distance between the first outer periphery and the first insulator, and a distance between the second outer periphery and the second insulator.

8. The device according to claim 1, wherein the first electrode layer disposed in the first level is located farther from the source-side select gate layer than the second electrode layer disposed in the second level while the second electrode layer is located farther from the drain-side select gate layer than the first electrode layer.

9. The device according to claim 1, wherein a thickness of the first electrode layer is substantially equal to a thickness of the second electrode layer.

10. The device according to claim 1, wherein the semiconductor body and the columnar insulating member are provided in a hole extending in the stacking direction through the stacked body, the hole having a central axis along the stacking direction, and a distance from the central axis to the first base surface is larger than a distance from the central axis to the second base surface.

11. A semiconductor device comprising:
a stacked body including a plurality of electrode layers stacked with an insulator interposed, a source-side select gate layer provided below the electrode layers, and a drain-side select gate layer provided above the electrode layers;
a semiconductor body extending in a stacking direction of the stacked body through the electrode layers and having a pipe shape, a plurality of memory cells being provided at intersecting portions of the semiconductor body with the electrode layers; and
a columnar insulating member extending in the stacking direction inside the semiconductor body having the pipe shape, the columnar insulating member being formed as one body inside an intersecting portion of the semiconductor body with a lowermost electrode layer of the electrode layers and inside an intersecting portion of the semiconductor body with the source-side select gate layer,
the electrode layers including a first electrode layer disposed in a first level in the stacking direction and a second electrode layer disposed in a second level in the stacking direction, one of the first level and the second level being located farther from the source-side select gate layer than the other of the first level and the second level while the other of the first level and the second level being located farther from the drain-side select gate layer than the one of the first level and the second level,
the insulator including a first insulator contiguous above the first electrode layer, a second insulator contiguous below the first electrode layer, a third insulator contiguous above the second electrode layer, and a fourth insulator contiguous below the second electrode layer, the first electrode layer being interposed between the first insulator and the second insulator, the second electrode layer being interposed between the third insulator and the fourth insulator,
a thickness of the first electrode layer being larger than both of a thickness of the first insulator and a thickness of the second insulator,
an outer periphery of the semiconductor body having a first outer periphery facing to the first insulator, a second outer periphery facing to the second insulator, a first base surface facing to the first electrode layer, a third outer periphery facing to the third insulator, a fourth outer periphery facing to the fourth insulator, and a second base surface facing to the second electrode layer, the first base surface being disposed between the first outer periphery and the second outer periphery and being defined by a surface substantially aligned in the stacking direction with the first outer periphery and the second outer periphery, the second base surface being disposed between the third outer periphery and the fourth outer periphery and being defined by a surface substantially aligned in the stacking direction with the third outer periphery and the fourth outer periphery, a diameter of the columnar insulating member at the first level being larger than a diameter of the columnar insulating member at the second level, a distance between the first base surface and the first electrode layer being larger than a distance between the second base surface and the second electrode layer.

12. The device according to claim 11, wherein the semiconductor body and the columnar insulating member are provided in a hole extending in the stacking direction through the stacked body and a stacked film is provided between the electrode layers and the semiconductor body in the hole.

13. The device according to claim 12, wherein the stacked film includes a silicon oxide film on a side of the semiconductor body and a silicon nitride film between the silicon oxide film and the electrode layers.

14. The device according to claim 11, wherein the memory cells include a tunnel insulating film, a charge storage film, and a block insulating film stacked at the intersecting portions in order on the outer periphery of the semiconductor body.

15. The device according to claim 14, wherein the block insulating film includes a silicon oxide film and a film having higher dielectric constant than the silicon oxide film.

16. The device according to claim 11, wherein the memory cells include a tunnel insulating film formed along the outer periphery of the semiconductor body, the tunnel insulating film extending in the stacking direction between the semiconductor body and the second electrode layer, between the semiconductor body and the third insulator, and between the semiconductor body and the fourth insulator.

17. The device according to claim 11, wherein the distance between the first base surface and the first electrode layer is larger than a distance between the first outer periphery and the first insulator, and a distance between the second outer periphery and the second insulator.

18. The device according to claim 11, wherein the first electrode layer disposed in the first level is located farther from the source-side select gate layer than the second electrode layer disposed in the second level while the second electrode layer is located farther from the drain-side select gate layer than the first electrode layer.

19. The device according to claim 11, wherein a thickness of the first electrode layer is substantially equal to a thickness of the second electrode layer.

20. The device according to claim 11, wherein the semiconductor body and the columnar insulating member are provided in a hole extending in the stacking direction through the stacked body, the hole having a central axis along the stacking direction, and a distance from the central axis to the first base surface is larger than a distance from the central axis to the second base surface.

* * * * *